United States Patent [19]

Eidschun

[11] 4,359,366
[45] Nov. 16, 1982

[54] PLATING CELL WITH CONTINUOUS CATHODE CONTACT AND METHOD

[75] Inventor: Charles D. Eidschun, Clearwater, Fla.

[73] Assignee: Micro-Plate, Inc.

[21] Appl. No.: 287,248

[22] Filed: Jul. 27, 1981

[51] Int. Cl.³ .................... C25D 5/02; C25D 17/28
[52] U.S. Cl. ........................... 204/15; 204/224 R
[58] Field of Search .................. 204/15, 224 R, 206

[56] References Cited

U.S. PATENT DOCUMENTS

| 4,036,705 | 7/1977 | Eidschun | 204/15 |
| 4,186,062 | 1/1980 | Eidschun | 204/224 R |

FOREIGN PATENT DOCUMENTS

| 49-16175 | 4/1974 | Japan | 204/15 |
| 52-24940 | 2/1977 | Japan | 204/15 |

Primary Examiner—T. Tufariello
Attorney, Agent, or Firm—Jack E. Dominik

[57] ABSTRACT

Disclosed is a method and apparatus for processing printed circuit boards which do not have a plating buss or plating bar by means of continuously passing the printed circuit boards through a plating cell in which a cathode brush is employed to contact the leads above the tabs while the brush is shielded both above and below in a chamber defined by a pair of shields. Desirably the chamber is pressurized with a gas, normally air, to preclude the migration of solutions such as electroplating solution from the plating cell onto the brush which would become plated itself and lose its effectiveness if contacted by the electrolyte. The plating cell utilizes a sparger and reverse flow chamber and an anode, the anode being positioned essentially in the reverse flow chamber to accomplish the plating. The anode is electrically energized and the cathode is independently energized to provide the current necessary for the plating.

10 Claims, 4 Drawing Figures

U.S. Patent
Nov. 16, 1982
4,359,366
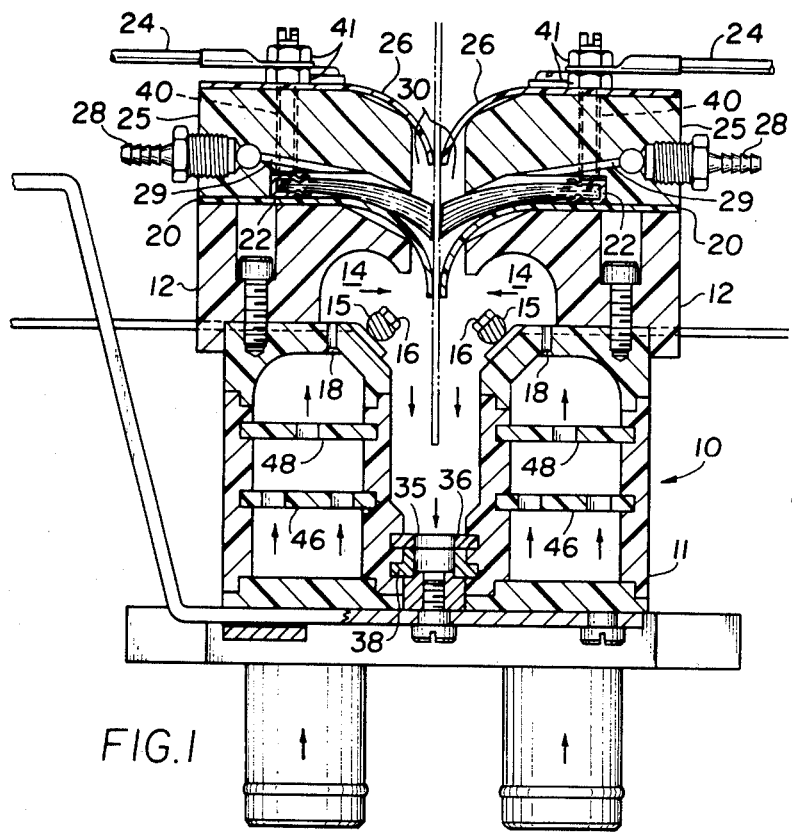
FIG. 1
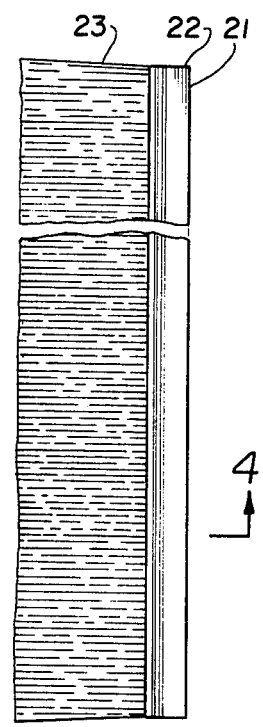
FIG. 3
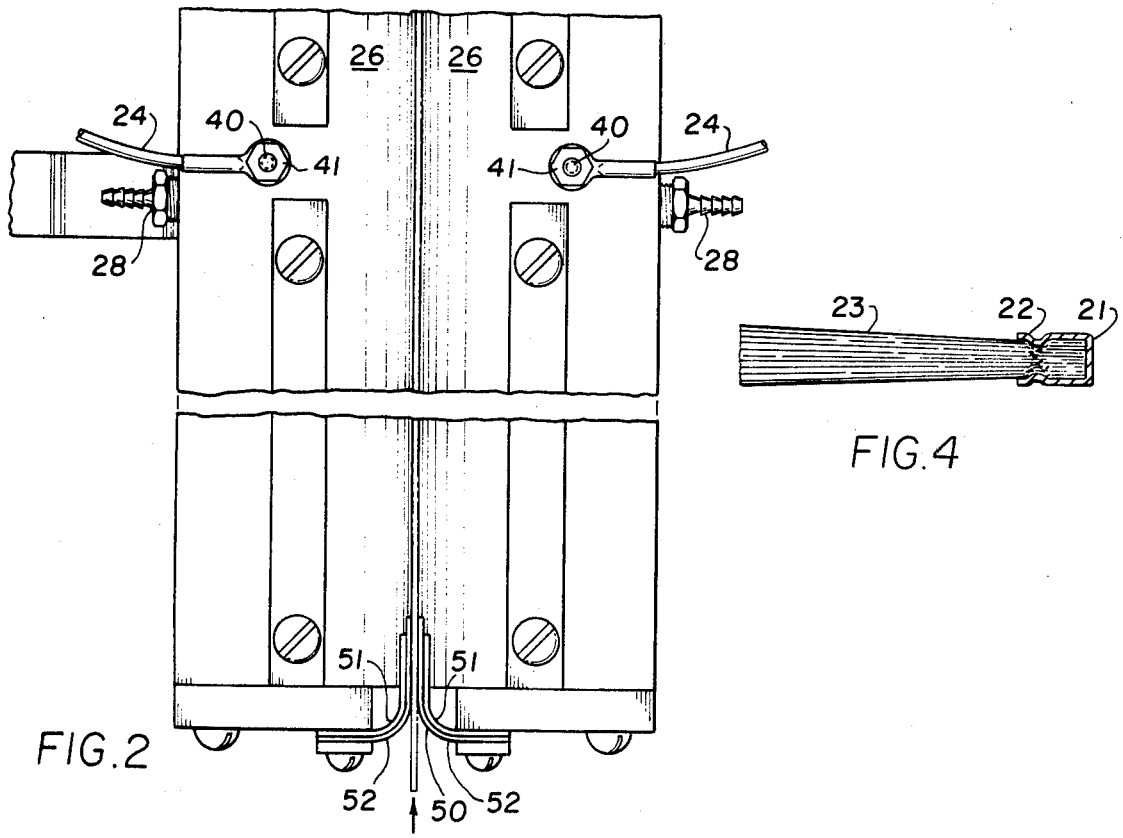
FIG. 2
FIG. 4

PLATING CELL WITH CONTINUOUS CATHODE CONTACT AND METHOD

FIELD OF INVENTION

The present invention is directed to an apparatus and method primarily useful in reworking printed circuit boards which have been rejected at final inspection due to low gold content on the connector contact tabs, surface problems or surface contaminations which result in poor contact, and other defects primarily located in the area where contact is made with the coupler employed to physically and electrically engage the printed circuit board. The field of invention is generally classified in U.S. Class 204, subclass 15 and subclass 224R.

PRIOR ART

The prior art is exemplefied by applicant's issued U.S. Pat. No. 4,036,705 which is useful in plating printed circuit boards and more particularly the tab contacts on the board and their closely related leads. Also illustrative of the prior art is applicant's U.S. Pat. No. 4,186,062 which plates the connector tabs of the printed circuit boards on a continuous basis as distinguished from the batch basis exemplified in U.S. Pat. No. 4,036,705.

Printed circuit boards after being processed and plated are normally mechanically routed prior to shipment to the customer. During this mechanical finish or routing the inner connecting plating buss also called the plating bar is removed. This renders the printed circuit board independent of the buss or plating bar and the only contact for the circuitry are the contact tabs normally at the upper and/or lower edge of the printed circuit board. Sometimes the tabs are rejected at final inspection due to low gold contact, surface problems, or surface contaminations which experience has indicated will result in poor electrical contact. The manufacturer then has the option of scrapping the printed circuit board, or repairing the boards by reworking. In large job shops, there is a substantial volume of printed circuit boards which are rejected, and accordingly it is highly desirable to have equipment which can economically repair such volumes of rejected printed circuit boards.

Additionally, not all printed circuit boards are plastic. Some are metal boards having a steel core coated with epoxy. The circuitry on the metal boards is produced using the additive process and no plating bar or buss is incorporated into the design. Thus it is also desirable to have a method and apparatus which can process the metal circuit boards by direct contact with the connector tabs since there is no plating buss or plating bar on the board.

SUMMARY

The present invention deals with a method of processing printed circuit boards which do not have a plating buss or plating bar by means of continuously passing the printed circuit boards through a plating cell in which a cathode brush is employed to contact the leads above the tabs while the brush is shielded both above and below in a chamber defined by a pair of shields. Desirably the chamber is pressurized with a gas, normally air, to preclude the migration of solutions such as electroplating solution from the plating cell onto the brush which would become plated itself and lose its effectiveness if contacted by the electrolyte. The plating cell utilizes a sparger and reverse flow chamber and an anode, the anode being positioned essentially in the reverse flow chamber to accomplish the plating. The anode is electrically energized and the cathode is independently energized to provide the current necessary for the plating.

In view of the foregoing it is a principal object of the present invention to provide a method and apparatus for reworking rejected printed circuit boards, and also for the plating of steel or other metal printed circuit boards on which there is no plating bar or plating buss.

A further object of the present invention is to provide a method and apparatus for the reworking of defective printed circuit boards and for the processing of metal boards which is a continuous plater and may be fed by a conveyor of various types such as opposed belts, chain links, and other constructions.

Yet another object of the present invention is to provide a method and apparatus for the reworking of printed circuit boards or the plating of connector contact tabs on metal boards in which the board is oriented vertically as a result of which uniform plating can be conducted on both sides of the board in a continuous process.

Another and important object of the present invention is to provide a method and apparatus for reworking printed circuit boards or plating metal boards which is economical to purchase and operate, and yet is efficient and effective in accomplishing its mission.

DESCRIPTION OF DRAWINGS

Further objects and advantages of the present invention will become apparent as the following description of an illustrative embodiment proceeds taken in conjunction with the accompanying drawings, in which:

FIG. 1 is a transverse sectional view of the interior portion of the subject plating cell;

FIG. 2 is a top view, partially broken, of the subject plating cell;

FIG. 3 is a plan view of a typical cathode brush employed in the subject plating cell;

FIG. 4 is a transverse sectional view of the brush shown in FIG. 3 taken along section line 4—4 of FIG. 3 and in an enlarged scale from FIG. 3.

DESCRIPTION OF PREFERRED EMBODIMENT

The illustrative plating cell is comparable from a standpoint of its "plumbing" to that shown in applicant's issued U.S. Pat. No. 4,186,062, and thus details shown therein are, where common, incorporated by reference. Also in applicant's copending U.S. application contemporaneously filed with this one, similar construction is shown including the choke mechanism for the fluid which may be employed in the construction of the subject plating cell 10 as shown in cross-section in FIG. 1. There it will be seen that a sparger assembly 11 is at the lower portion of the cell 10 and a flow guide is positioned atop the sparger assembly defining at one end a reverse flow chamber 14. The anode 15 is positioned within the reverse flow chamber 14, and secured to the upper inner portion of the sparger by an anode nut 16. The construction of the plating cell 10 is essentially a mirror image on both sides flanking the printed circuit board.

The electrolyte or plating solution is passed through discharge orifice 18 in the upper portion of the sparger, and when it contacts the flow guide 12 in the reverse flow chamber the flow of the fluid is reversed and it is constantly in solution bath contact with the anode 15.

A shield 20, preferably formed of natural polypropylene, is positioned atop the flow guide and engages the printed circuit board in a curvilinear tangential fashion, thereby shielding the spray from the discharge 18 from migrating up the printed circuit board.

A cathode brush 21 having a brush bar 22 containing a comb of bristles 23 is secured for contact with the printed circuit board by being clamped in position by the upper shield block 25, and further defining a brush chamber 30 between the lower shield 20 and the upper shield 26.

An air coupler 28 is provided in the upper shield block 25 and leads to an air discharge 29. The air is led into the brush chamber 30 and is normally pressurized. Whenever reference is made to "air" it will be understood that other gaseous media capable of pressurization are contemplated. In the present application the air is pressurized between 5 and 30 psi depending on cell size and the board width. The purpose of the pressurized air is to constantly provide a pressure downwardly into the reverse flow chamber 14 and the balance of the interior of the cell 10 to inhibit the migration of electroplating fluid up along the printed circuit board through cracks or criveces, or through the delta area formed at the front and rear of the printed circuit board. Because the cathode brush 21 is constantly electrically energized, any electroplating fluid contacting the brush could result in plating the brush itself and forcing premature maintenance by way of cleaning or replacing the cathode brush 21. The air pressure, on the other hand, is adjusted so that the solution draining from the plating cell 10 does not contain an excess amount of air bubbles which would also interfere with the plating process.

The plating cell 10 also includes at its lower portion a choke assembly 35 comprising a fixed choke bar 36 and an adjustable choke bar 38. By means of apparatus as shown in my copending patent application, the adjustable choke bar 38 can be moved in and out of register with the fixed choke bar 36, both of which have spaced holes which can be in perfect register or moved to a position of total shut off. The operator then has two variables to adjust, the choke bar to determine the rate of discharge of fluid below the reverse flow chamber 14, and also the amount of pressured air being admitted into the brush chamber 30. These are balanced out to achieve an optimum between leakage, and the formation of bubbles in the fluid passing to a reservoir for recirculation which would be harmful to further plating action.

Electrically the anode is coupled to one source of DC current, and a contact wire 24 provided to energize a cathode lead 40, secured to the upper shield block 25 by means of opposed nuts 41. The cathode lead 40 is shown as a bolt which bears down on the brush bar 22 portion of the cathode brush 21, and thereafter transmitting plating current to the bristles 23, preferably stainless steel as to the brush bar as well as bristles, and thereafter in wiping contact with the leads on the printed circuit board.

As noted in FIG. 2, the upper shield block 25 does secure the upper shield 26 into face-to-face relationship with the printed circuit board. Also at each end of the plating cell 10, provision is made for a squeegee gate assembly 50 having an inner wiper 51 and an outer wiper 52. Preferably the wipers are formed of a Teflon-type composition, and have a wiping action on the printed circuit board to isolate the electrolyte to the interior portion of the plating cell 10.

The method of plating, in summary, comprises the steps of reworking a printed circuit board or plating a printed circuit board which does not have a plating buss or plating bar by orienting the board in a vertical configuration for continuous passage through a plating cell. A plating brush is then provided in opposed relationship to a like plating brush to wipingly engage the leads of the printed circuit board as the same are passed by the brush. Desirably a brush chamber defined by a pair of flexible shields surrounds the brushes, and is pressurized by air or other gaseous medium to inhibit the migration of any plating fluid upwardly along the printed circuit board or through the delta area into the cathode chamber. In addition the sparger discharge is provided with an adjustable choke mechanism in which the discharge rate of the plating fluid can be adjusted to assist in avoiding bubbling, but at the same time to inhibit the pumping action of the fluid up the printed circuit board or through the delta area formed at the end of the printed circuit boards. Finally, a squeegee action is contemplated at both ends of the plating cell to confine the electrolyte to the interior portion of the plating cell. The cathode is energized by means of cathode current from a rectifier, and the anode similarly energized by the opposite polarity of current from the rectifier.

Although particular embodiments of the invention have been shown and described in full here, there is no intention to thereby limit the invention to the details of such embodiments. On the contrary, the intention is to cover all modifications, alternatives, embodiments, usages and equivalents of a plating cell with continuous cathode contact, as fall within the spirit and scope of the present invention, specification, and appended claims.

I claim:

1. A method of plating connector contact tabs on a printed circuit board which printed circuit board does not have a plating buss or plating bar comprising the steps of:
   orienting the board for continuous movement in a vertical plane,
   providing a cathode brush chamber in surrounding relationship to a cathode brush which can be energized for supplying plating current to the printed circuit board,
   providing shields both above and below the cathode brush to define a brush chamber,
   providing a reverse flow chamber for electrolyte in open communication with a sparger immediately beneath the cathode brush,
   and flowing electrolyte into the reverse flow chamber which is energized by an anode to permit the plating of that portion of the printed circuit board beneath the lower shield defining the cathode chamber and the lower portion of the printed circuit board.

2. In the method of claim 1,
   the additional step of providing means for applying gaseous pressure interiorly of the brush chamber to further inhibit the migration of plating solution upwardly into the brush chamber.

3. In the method of claim 1,
   the additional step of choking the electrolyte solution interiorly of the plating cell adjustably to maintain a sufficient drain to reduce any tendency for pumping of the electrolyte in the delta area formed by the engagement of the shield with the printed circuit board.

4. In the method of claim 1,
providing a brush having conductive bristles preferably of stainless steel, and securing the bristles by a conductive brush bar in electrical communication with a cathode source of electrical energy.

5. In the method of claim 2,
adjusting the gaseous pressure within the brush chamber between a range of 5 and 30 psi.

6. A plating cell for printed circuit boards comprising, in combination,
a sparger assembly,
a flow guide positioned above the sparger assembly having an edge portion defining a reverse flow chamber,
an anode positioned below the flow guide,
a sparger discharge sending pressure plating solution into the reverse flow chamber where its flow is essentially reversed to impinge upon the lower portion of the printed circuit board,
a shield positioned on the flow guide and flexibly engaging a printed circuit board opposite the reverse flow chamber,
a cathode brush which is electrically conductive positioned atop the flow guide,
an upper shield block positioned atop the cathode brush,
an upper shield depending downwardly from the upper shield block and curvingly engaging the printed circuit board and defining between the upper shield and the lower shield a brush chamber,
and electrical coupling means for engaging the conductive brush with a cathode source of plating energy.

7. In the plating of claim 6,
an air coupler secured in open communication with the brush chamber,
and means for providing a pressure gas into the brush chamber.

8. In the plating cell of claim 6 above,
an adjustable choke assembly provided at the lower portion of the printed circuit board to drain electrolyte passing downwardly from the reverse flow chamber.

9. In the plating cell of claim 6 above,
squeegee gates at the receiving end and the discharge end of the plating cell oriented in essentially perpendicular relationship with the upper shield and lower shield defining the brush chamber.

10. In the plating cell of claim 6 above,
the subject cathode brush being formed of stainless steel, bristles secured by means of a stainless steel brush bar,
and means for electrically engaging the brush bar to a cathode source of plating energy.

* * * * *